United States Patent
Curatolo et al.

(10) Patent No.: US 9,672,941 B1
(45) Date of Patent: Jun. 6, 2017

(54) MEMORY ELEMENT STATUS DETECTION

(71) Applicant: Infineon Technologies AG, Neubiberg (DE)

(72) Inventors: Giacomo Curatolo, Unterhaching (DE); Thomas Kern, Ascheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/018,264

(22) Filed: Feb. 8, 2016

(51) Int. Cl.
*G11C 7/00* (2006.01)
*G11C 29/50* (2006.01)

(52) U.S. Cl.
CPC .............. *G11C 29/50* (2013.01); *G11C 7/00* (2013.01); *G11C 2029/5004* (2013.01); *G11C 2029/5006* (2013.01)

(58) Field of Classification Search
CPC ........................................................ G11C 7/00
USPC .................................................... 365/189.09
See application file for complete search history.

(56) References Cited

U.S. PATENT DOCUMENTS

2009/0303796 A1* 12/2009 Abe ..................... G11C 7/06
  365/185.17
2011/0299319 A1* 12/2011 Kono ................ G11C 13/0002
  365/148

* cited by examiner

*Primary Examiner* — Hoai V Ho
(74) *Attorney, Agent, or Firm* — Schiff Hardin LLP

(57) ABSTRACT

A circuit having a memory element coupled between and having a full voltage between two supply rails; and a detection unit coupled to the memory element and configured to maintain a substantially constant biasing of the memory element while simultaneously detecting current flow through the memory element.

18 Claims, 5 Drawing Sheets

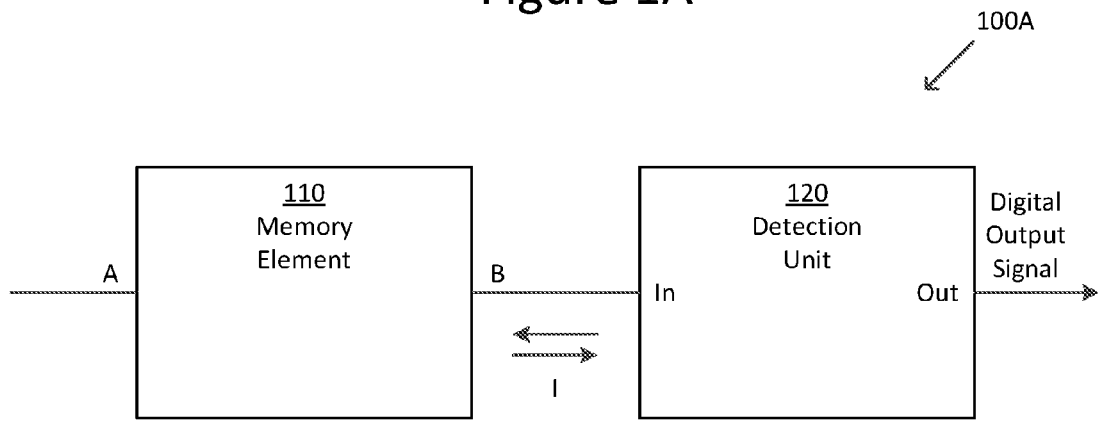
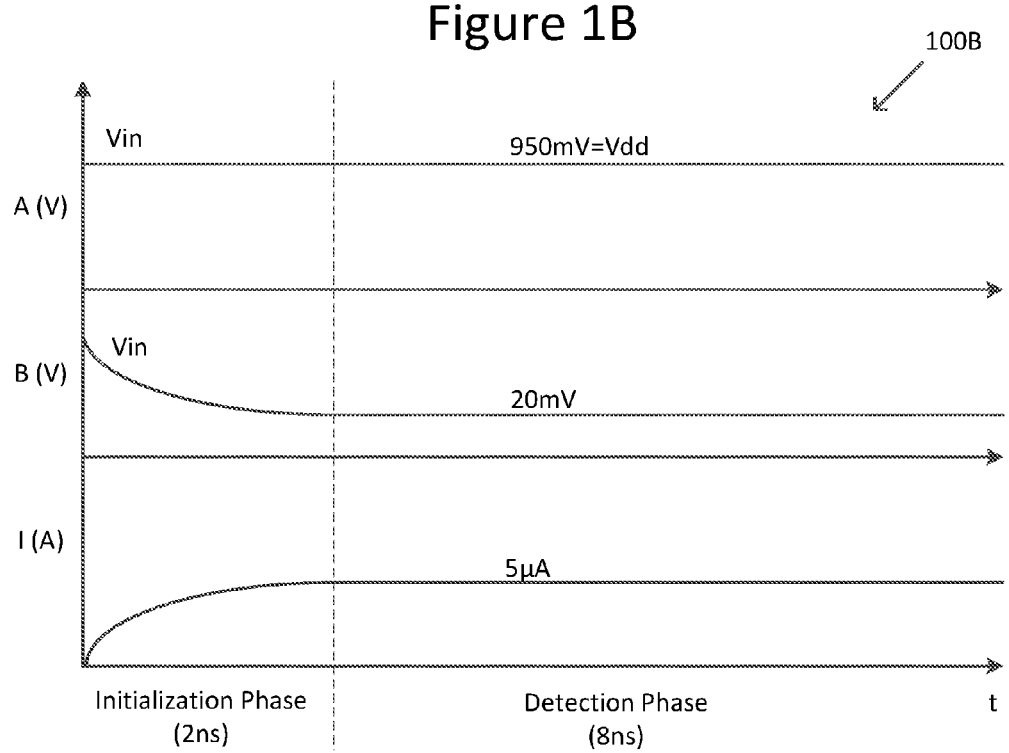

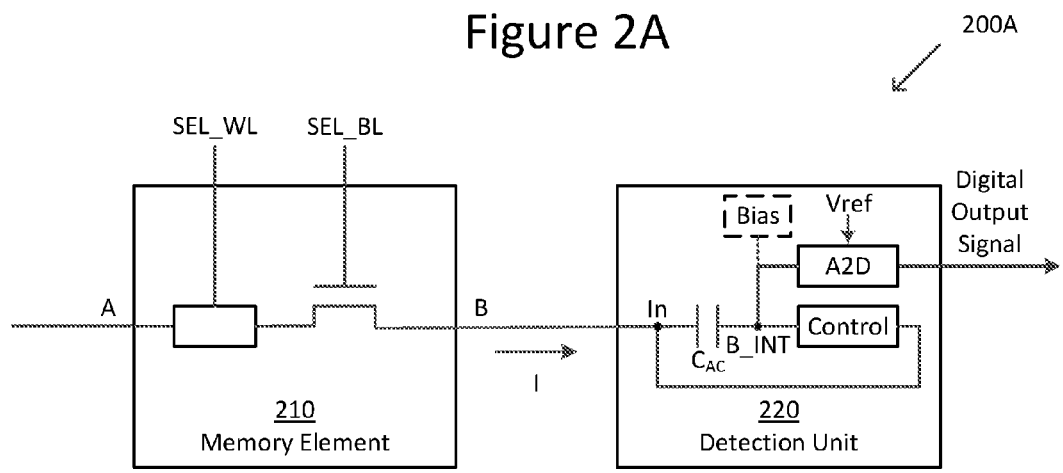
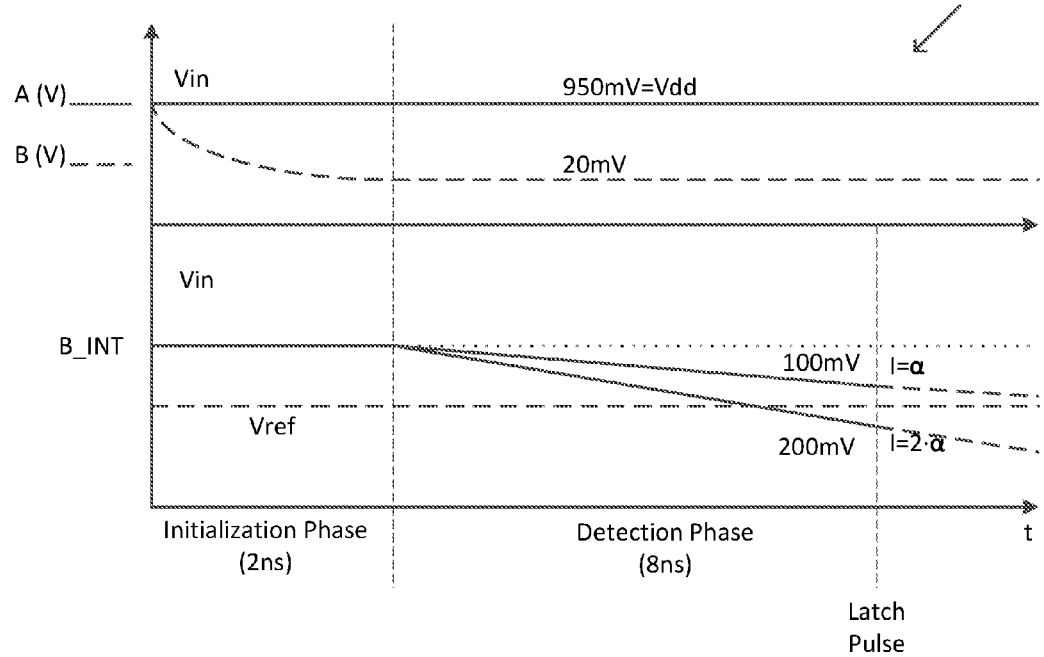

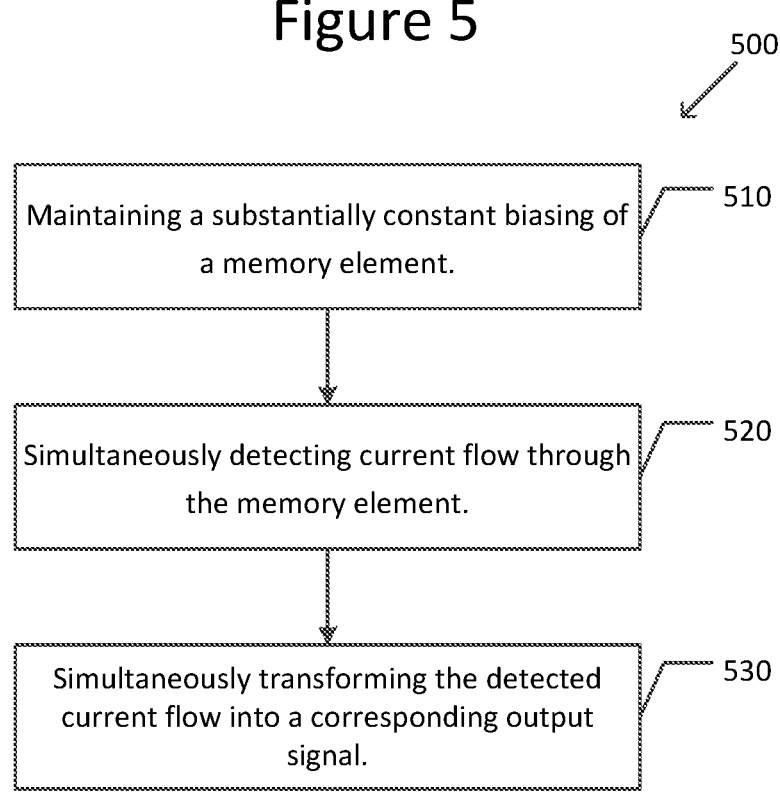

MEMORY ELEMENT STATUS DETECTION

TECHNICAL FIELD

The present disclosure generally relates to a memory element status detection circuit, and more specifically, to a memory element status detection circuit that maintains a substantially constant biasing of a memory element while simultaneously detecting current flow through the memory element.

BACKGROUND

Reading from an embedded memory element is a power-consuming operation because circuit elements operate at maximum speed. As a consequence, the available internal voltage during a read operation is lower than during other operations. Also, higher computational performance and algorithm complexity require less access time but more memory available for code and data. These two requirements are in contradiction as a larger memory array implies a higher time constant and therefore a longer amount of time to retrieve stored information.

BRIEF DESCRIPTION OF THE DRAWINGS

FIG. 1A illustrates a memory element status detection circuit in accordance with the disclosure.

FIG. 1B illustrates a graph corresponding to the memory element status detection circuit of FIG. 1A.

FIG. 2A illustrates a memory element status detection circuit in accordance with the disclosure.

FIG. 2B illustrates a graph corresponding to the memory element status detection circuit of FIG. 2A.

FIG. 5 illustrates flowchart of a method in accordance with the disclosure.

DESCRIPTION OF THE ASPECTS

Figure 3A:
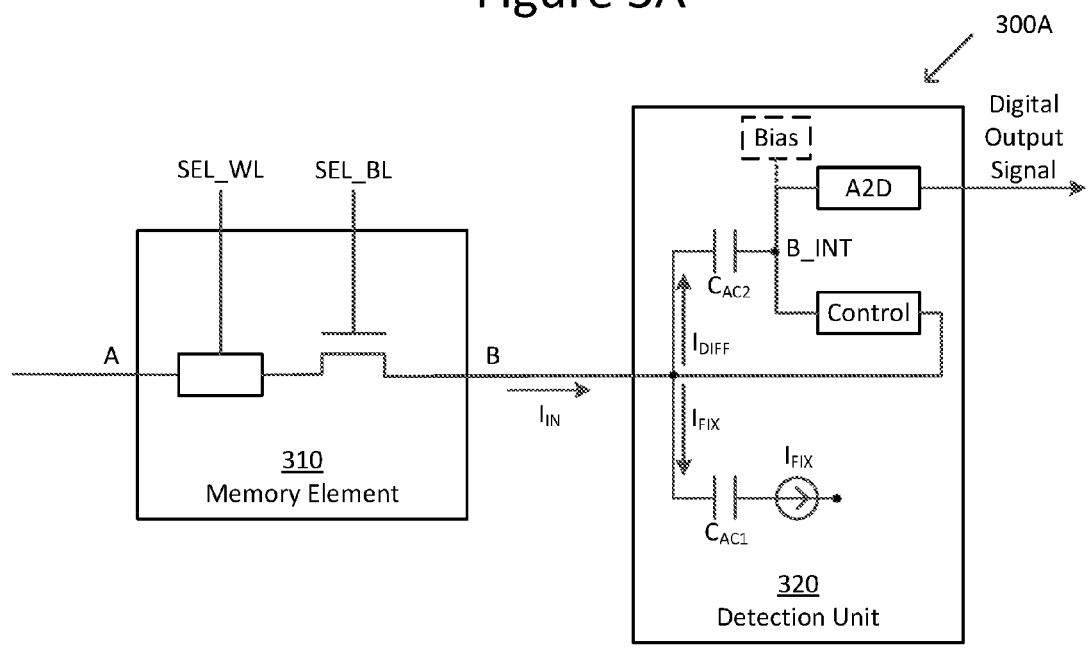
FIG. 3A illustrates a memory element status detection circuit in accordance with the disclosure.

The present disclosure is directed to a circuit having a memory element coupled between and having a full voltage between two supply rails, and a detection unit coupled to the memory element and configured to maintain a substantially constant biasing of the memory element while simultaneously detecting current flow through the memory element.

The detection unit keeps unchanged biasing conditions over the memory element while simultaneously extracting information from current flowing through the memory element and converting this current into a corresponding digital signal. The detection unit of this disclosure is advantageous in that it operates with a lowest possible voltage, that is, the voltage used for the memory element's direct current (DC) biasing, permits flexibility in selecting the memory element's biasing conditions, and extracts information stored in the memory element while avoiding unnecessary time consuming transients. Further, the memory element in a case of a low voltage application may have a full rail-to-rail voltage if voltage headroom is needed, or in a case of having sufficient or too much voltage, the biasing conditions may be specified.

FIG. 1A illustrates a memory element status detection circuit 100A in accordance with the disclosure.

The memory element status detection circuit 100A comprises a memory element 110 coupled with a detection unit 120. The memory element 110 has terminal access points A and B. The memory element current I may flow in either direction, that is, from the memory element 110 to the detection unit 120 or in the reverse direction. The memory element 110 is coupled between and has a full voltage between two supply rails.

The detection unit 120 has an input terminal In and an output terminal Out. The detection unit 120 is configured to maintain a substantially constant biasing of the memory element 110 while simultaneously detecting current flow I through the memory element 110 and transforming the detected current flow I into a corresponding output signal. The detection unit 120 maintains the substantially constant biasing by constraining the applied voltages at the memory element terminal access points A and/or B. A "substantially constant" biasing of the memory element 110 means that the biasing is sufficient so as to not change a status of the memory element 110, in other words, to take into consideration natural fluctuations of the circuit 100A. A natural fluctuation could be, for example, the voltage drop of the metal lines which are required to connect the memory cells to the external peripheral circuitry.

FIG. 1B illustrates a graph 100B corresponding to the memory element status detection circuit 100A of FIG. 1A.

In this example of graph 100B, terminal access point A has a voltage that is higher than that terminal access point B, though the disclosure is not limited in this regard. I is the current through the input terminal In the detection unit 120. The initialization phase, as is known, brings an unselected memory element 110 initially having a low bias into a target biasing scheme to perform a read during a detection phase. During the detection phase, the detection unit 120 maintains a substantially constant biasing of the memory element 110 by constraining the applied voltages at the memory element terminal access points A and/or B.

FIG. 2A illustrates a memory element status detection circuit 200A in accordance with the disclosure. FIG. 2B illustrates a graph 200B corresponding to the memory element status detection circuit 200A of FIG. 2A.

The memory element status detection circuit 200A comprises a memory element 210 and a detection unit 220. The memory element 210 and the detection unit 220 correspond to the memory element 110 and the detection unit 120, respectively, of FIG. 1A. It is assumed that the memory element 110 is embedded in a matrix where the output parallelism is reduced via a multiplexer on the bitline side and a selection mechanism on the wordline side to select or address the memory element 110.

The detection unit 220 comprises a capacitor $C_{AC}$, a control unit, and a signal converter A2D. A bias unit is an optional element described below with respect to FIG. 4.

The capacitor $C_{AC}$ has a first terminal at node In coupled to the terminal access point B of the memory element 210, and is configured to direct current (DC) decouple the detection unit 220 from the memory element 210. The memory element current I flows to the capacitor $C_{AC}$ to implement an AC coupling, and is charged with a rate depending on the memory element current I and a capacitance value of capacitor $C_{AC}$. The detection unit 220 is thus completely decoupled from a static voltage level of the terminal access point B.

The control unit is coupled to a second terminal of the capacitor $C_{AC}$ at node B_INT, and is configured to maintain a voltage of at least one of the memory element 210'2 terminal access point B, substantially constant. The control unit adjusts node B_INT to the voltage which is needed to keep node B constant. The voltage level is decreased as indicated in FIG. 2B. The slope of B_INT depends on the current value and decreases after the initialization phase as the straight, dashed line labeled at B_INT, such that at the end of the initialization phase, node B_INT reaches the reference voltage Vref.

During the detection phase, if the voltage at node B_int, indicated by the solid lines, crosses the reference voltage, indicated by the dashed line, then the memory element changes from 1 to 0 or 0 to 1. For example, in FIG. 2B, 100 mV (I=α) is above the reference voltage and may indicate a low memory element current I, which may be defined as a stored 0. Also, 200 mV (I=2α) is below the reference voltage, and may indicate a high memory element current I, which may be defined as a stored 1. This control unit differs from previous control units in that it is not part of the memory element signal path consuming voltage headroom, instead it is part of an extra path.

During the detection phase the biasing condition of the terminal access point B is maintained by forcing a voltage on the capacitor terminal $C_{AC}$ at node B_INT resulting in a constantly decreasing/increasing of the capacitor absolute voltage without a change in voltage at the terminal access point B. Node B_INT is the sense node and varies depending on the memory element current I. The control unit ensures that terminal access point B is capped at a constant level during the detection phase.

It is not necessary to wait during the initialization phase for the voltage at node B_INT to reach a specific reference voltage, that is, a supply rail voltage. The memory element status detection circuit 200A may still function properly at another reference voltage that is maintained constant.

The signal converter A2D is coupled to the capacitor's $C_{AC}$ second terminal at node B_INT, and is configured to transform detected voltage level of B_INT by comparing the B_INT level to the reference voltage Vref and output a corresponding signal. The signal converter A2D may be an analog-to-digital converter configured to transform the detected voltage level B_INT into a digital output signal. Current that is converted into a voltage by capacitor $C_{AC}$ is processed into corresponding digital information of the memory element 210. No extra voltage than that applied to the terminal access points A and B is necessary in the signal path, thereby limiting the internal voltage range to that required by the memory element 120 and allowing flexibility on the terminal access point biasing conditions.

At an appropriate time, a trigger signal should be generated, such as by a latch pulse, to compare the voltage of the node B_INT with a reference voltage to determine a value of the memory element 210.

Figure 3B:
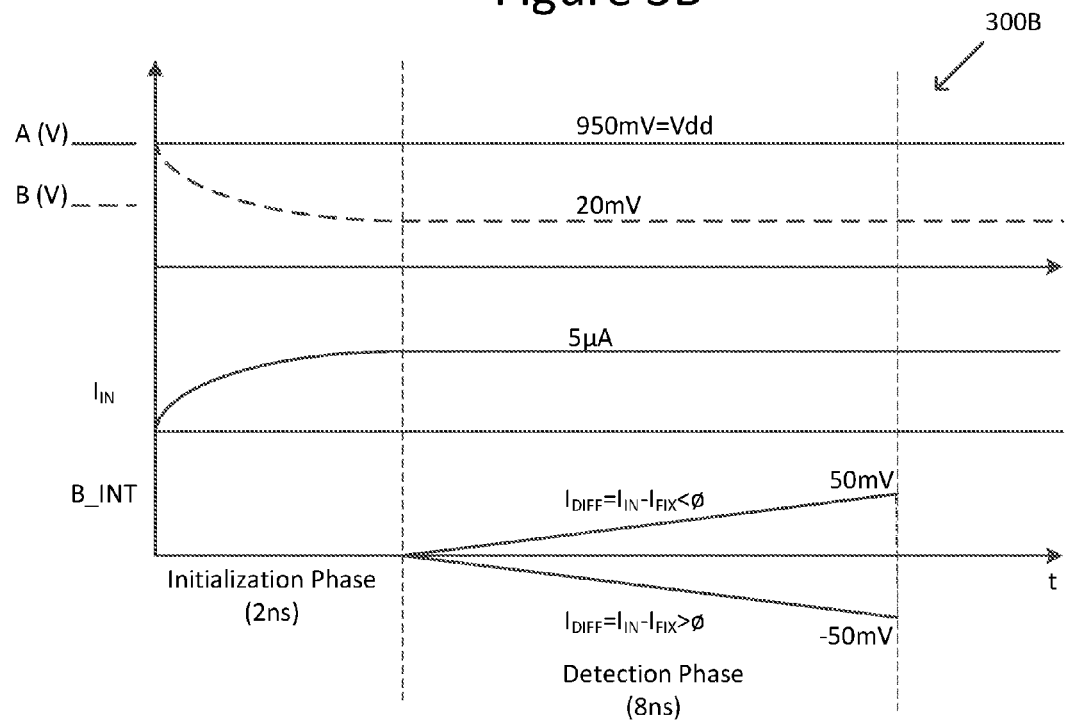
FIG. 3B illustrates a graph corresponding to the memory element status detection circuit of FIG. 3A.

FIG. 3A illustrates a memory element status detection circuit 300A in accordance with the disclosure. FIG. 3B illustrates a graph 300B corresponding to the memory element status detection circuit 300A of FIG. 3A.

The memory element status detection circuit 300A comprises a memory element 310 and a detection unit 320. The memory element 310 and the detection unit 320 correspond to the memory element 110 and the detection unit 120, respectively, of FIG. 1A.

The detection unit 320 comprises a first branch and a second branch. The first branch comprises a first capacitor $C_{AC1}$ having first and second terminals, and a fixed current source $I_{FIX}$ coupled to the second terminal of the first capacitor $C_{AC1}$. The second branch comprises a second capacitor $C_{AC2}$ having first and second terminals, a control unit coupled between the first and second terminals of the second capacitor $C_{AC2}$, a signal converter A2D coupled to the second terminal of the second capacitor $C_{AC2}$, and optionally, a bias unit is that is described below with respect to FIG. 4. The signal converter A2D is configured to transform detected voltage level of B_INT into the output signal. The signal converter A2D may be an analog-to-digital converter configured to transform the voltage level B_INT into a digital output signal.

As with the detection unit 220 of FIG. 2A, the detection unit 320 is configured to maintain a voltage of at least one of the memory element's 310 terminal access points A and/or B substantially constant.

In the embodiment of FIG. 3A, the capacitor $C_{AC}$ of FIG. 2A is split into two capacitors $C_{AC1}$ and $C_{AC2}$ to divide the memory element's 310 current flow I into a fixed current $I_{FIX}$ (reference current) and a controlled difference current $I_{DIFF}$. More specifically, a first capacitor $C_{AC1}$ is configured to sink from the terminal access point B a fixed current $I_{FIX}$. A second capacitor $C_{AC2}$ is configured to hold the terminal access point B by sinking/forcing the remaining needed current. The second capacitor $C_{AC2}$ senses a differential current $I_{DIFF}$ between the memory element current I and a reference current $I_{FIX}$ developing a differential signal that based on the sign (positive or negative) is an indicator of the memory element 310 status. The control unit 320 is thus operating around a limited current range around the reference current $I_{FIX}$, as opposed to the control unit 220 of FIG. 2A that is operating over an entire current range of the memory element 210. To determine a content of the memory element 310 it is only necessary to know whether the memory element current I is higher than the fixed current $I_{FIX}$ ($I-I_{FIX}>0$) or lower than the fixed current $I_{FIX}$ ($I-I_{FIX}<0$), as shown in FIG. 3B. The amount the memory element current I is above or below the fixed current $I_{FIX}$ is not important for sense margin and robustness.

Figure 4:
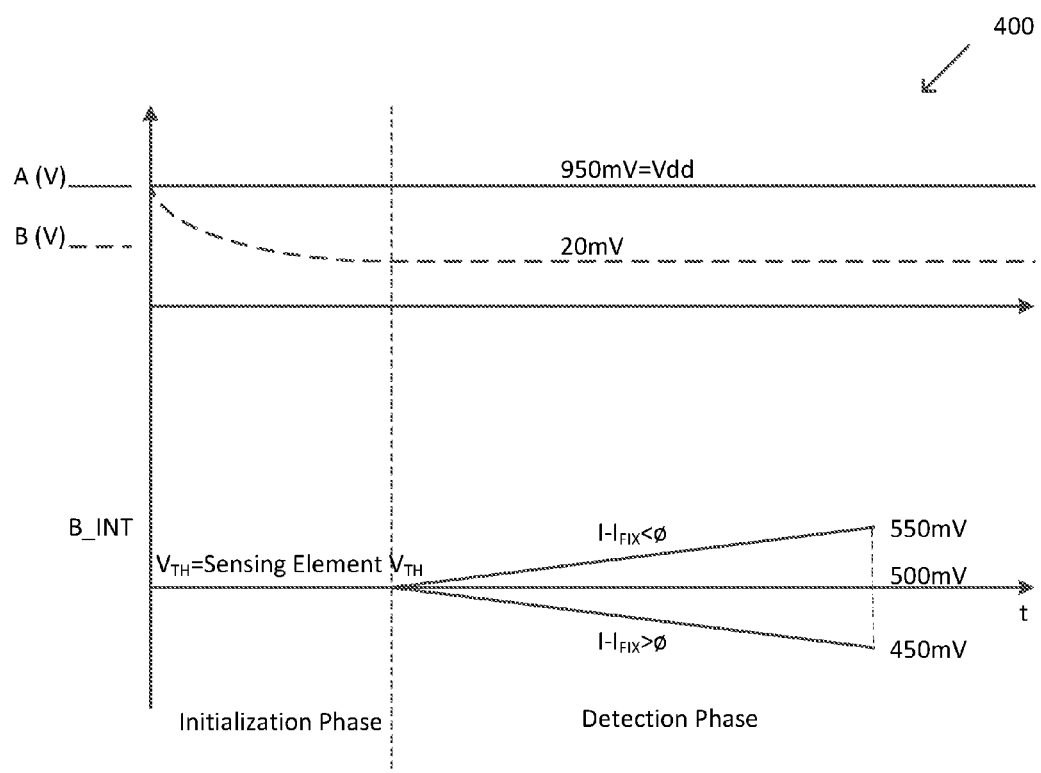
FIG. 4 illustrates a graph corresponding to the memory element status detection circuits of any of FIGS. 1A, 2A, and 3A.

FIG. 4 illustrates a graph 400 corresponding to the memory element status detection circuits 100A, 200A, 300A of any of FIGS. 1A, 2A, and 3A.

A biasing unit may be added to any of the detection element 120, 220, 320 of FIGS. 1A, 2A, 3A, respectively, and is shown in each of FIGS. 2A and 3A using a dashed box. The biasing unit is configured to directly bias the second terminal of the capacitor ($C_{AC}$, in FIG. 2A, and $C_{AC2}$ in FIG. 3A) at node B_INT. The biasing of the node B_INT is done during the initialization phase such that the signal converter A2D and the control circuit suffer minimum offset and/or optimum dynamic characteristics.

Node B_INT is biased to a threshold voltage $V_{TH}$ of the detection unit 120, 220, 320. The detection unit 120, 220, 320 discriminates whether the memory element current I is higher or lower than a reference current, compensating also for the mismatch of the detection element 120, 220, 320.

FIG. 5 illustrates flowchart 500 of a method in accordance with the disclosure.

In Step 510, a substantially constant biasing of the memory element 110, 210, 310 is maintained. This substantially constant biasing is maintaining by maintaining at least one terminal access point A and/or B of the memory element 110, 210, 310 substantially constant.

In Step 520, while maintaining the substantially constant biasing of the memory element 110, 210, 310, current flow I through the memory element 110, 210, 310 is detected. The memory element 110, 210, 310 is coupled between and has a full voltage between two supply rails.

In Step 530, while maintaining the substantially constant biasing of the memory element 110, 210, 310, the detected current flow I is simultaneously transformed into a corresponding output signal.

The memory element 110, 210, 310 may be any nonvolatile memory element, such as SRAM, MRAM, DRAM, flash, floating gate, BCRAM, etc. More generally, the memory element 110, 210, 310 may be any memory element where the signal is a current.

The specific voltage, current, and time values shown the figures are merely examples to aid in the description. The disclosure is not limited to these specific values.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A circuit, comprising:
   a memory element coupled between and having a full voltage between two supply rails; and
   a detection unit coupled to the memory element and configured to maintain a substantially constant biasing of the memory element while simultaneously detecting current flow through the memory element.

2. The circuit of claim 1, wherein the detection unit is further configured to maintain the substantially constant biasing of the memory element while simultaneously transforming the detected current flow into a corresponding output signal.

3. The circuit of claim 1, wherein the detection unit is configured to maintain the substantially constant biasing of the memory element by maintaining at least one terminal access point of the memory element substantially constant.

4. The circuit of claim 1, wherein the detection unit is configured to maintain the substantially constant biasing of the memory element by maintaining a plurality of terminal access points of the memory element substantially constant.

5. The circuit of claim 1, wherein the detection unit comprises:
   a capacitor having a first terminal coupled to a terminal access point of the memory element and configured to decouple the detection unit from the memory element;
   a control unit coupled to a second terminal of the capacitor, and configured to maintain a voltage of at least one of the terminal access point of the memory element substantially constant; and
   a signal converter coupled to the second terminal of the capacitor and configured to transform detected voltage into a corresponding output signal.

6. The circuit of claim 5, wherein the signal converter is an analog-to-digital converter configured to transform detected voltage into a digital output signal.

7. The circuit of claim 5, further comprising:
   a biasing unit configured to direct-current bias the second terminal of the capacitor.

8. The circuit of claim 1, wherein the detection unit is configured to divide the current flow through the memory element into a fixed current and a controlled difference current that is a difference between the current flow through the memory element and the fixed current.

9. The circuit of claim 1, wherein the detection unit comprises:
   a first branch comprising:
      a first capacitor having first and second terminals; and
      a fixed current source coupled to the second terminal of the first capacitor; and
   a second branch comprising:
      a second capacitor having first and second terminals;
      a control unit coupled between the first and second terminals of the second capacitor, and configured to maintain a voltage of at least one of the terminal access points of the memory element substantially constant; and
      a signal converter coupled to the second terminal of the second capacitor, and configured to transform detected voltage into the output signal.

10. The circuit of claim 9, wherein the signal converter is an analog-to-digital converter configured to transform the detected voltage into a digital output signal.

11. The circuit of claim 9, further comprising:
    a biasing unit configured to direct-current bias the second terminal of the second capacitor.

12. A method for reading a memory element, the method comprising:
    maintaining a substantially constant biasing of the memory element; and
    simultaneously detecting current flow through the memory element,
    wherein the memory element is coupled between and having a full voltage between two supply rails.

13. The method of claim 12, further comprising:
    maintaining the substantially constant biasing of the memory element while simultaneously transforming the detected current flow into a corresponding output signal.

14. The method of claim 12, wherein the maintaining the substantially constant biasing of the memory element comprises:
    maintaining at least one terminal access point of the memory element substantially constant.

15. The method of claim 12, further comprising:
    transforming the detected current flow into the output signal.

16. The method of claim 12, further comprising:
    directly bias a sense node of the detected current flow.

17. The method of claim 12, further comprising:
    dividing the current flow through the memory element into a fixed current and a controlled difference current that is a difference between the current flow through the memory element and the fixed current.

18. A circuit, comprising:
    a memory element coupled between and having a full voltage between two supply rails; and
    a detection means coupled to the memory element and for maintaining a substantially constant biasing of the memory element while simultaneously detecting current flow through the memory element.

* * * * *